United States Patent
Cao et al.

(10) Patent No.: US 9,502,235 B2
(45) Date of Patent: Nov. 22, 2016

(54) THIN FILM TRANSISTOR, METHOD FOR MANUFACTURING THE SAME, ARRAY SUBSTRATE AND DISPLAY DEVICE

(71) Applicant: BOE TECHNOLOGY GROUP CO., LTD., Beijing (CN)

(72) Inventors: Zhanfeng Cao, Beijing (CN); Xuehui Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 60 days.

(21) Appl. No.: 13/991,729

(22) PCT Filed: Dec. 13, 2012

(86) PCT No.: PCT/CN2012/086501
§ 371 (c)(1),
(2) Date: Jun. 5, 2013

(87) PCT Pub. No.: WO2013/127229
PCT Pub. Date: Sep. 6, 2013

(65) Prior Publication Data
US 2014/0061634 A1    Mar. 6, 2014

(30) Foreign Application Priority Data

Feb. 27, 2012  (CN) .......................... 2012 1 0047937

(51) Int. Cl.
*H01L 21/02*    (2006.01)
*H01L 29/786*   (2006.01)
(Continued)

(52) U.S. Cl.
CPC ..... *H01L 21/02244* (2013.01); *H01L 27/1248* (2013.01); *H01L 29/66969* (2013.01); *H01L 29/7869* (2013.01); *H01L 29/78606* (2013.01)

(58) Field of Classification Search
CPC ................... H01L 21/02244; H01L 29/78606
USPC ...................................... 257/40, 43; 438/104
See application file for complete search history.

(56) References Cited

U.S. PATENT DOCUMENTS 5,470,769 A     11/1995  Kim
5,610,082 A  *   3/1997  Oh ........................... G03F 7/00
                                                    148/DIG. 43

(Continued)

FOREIGN PATENT DOCUMENTS

CN    101625977 A    1/2010
CN    101740636 A    6/2010

(Continued)

OTHER PUBLICATIONS

Second Chinese Office Action Appln. No. 201210047937.5: Dated Sep. 24, 2014.

(Continued)

*Primary Examiner* — Allen Parker
*Assistant Examiner* — Stephen Bradley
(74) *Attorney, Agent, or Firm* — Ladas & Parry LLP (57) ABSTRACT

According to embodiments of the invention, a thin film transistor (TFT), a manufacturing method of the TFT, an array substrate and a display device are provided. The manufacturing method of the TFT comprises: forming a gate electrode on a substrate; forming a gate insulating layer on the substrate formed with the gate electrode; forming an oxide semiconductor active layer, an etch stop layer and a source/drain electrode on the gate insulating layer, wherein the etch stop layer is obtained by an oxidation treatment.

4 Claims, 6 Drawing Sheets

(51) Int. Cl.
*H01L 27/12* (2006.01)
*H01L 29/66* (2006.01)

(56) References Cited

U.S. PATENT DOCUMENTS

| | | | |
|---|---|---|---|
| 8,723,179 B2 * | 5/2014 | Yun | H01L 27/1214 257/59 |
| 2008/0206935 A1 | 8/2008 | Jang et al. | |
| 2010/0123131 A1 | 5/2010 | Tokunaga | |
| 2010/0213460 A1 * | 8/2010 | Kondo | H01L 27/1222 257/43 |
| 2010/0308324 A1 * | 12/2010 | Kim et al. | 257/43 |
| 2012/0018720 A1 * | 1/2012 | Park et al. | 257/43 |
| 2012/0211746 A1 | 8/2012 | Kim et al. | |
| 2013/0037807 A1 * | 2/2013 | Fukaya | H01L 27/1225 257/57 |

FOREIGN PATENT DOCUMENTS

| | | |
|---|---|---|
| CN | 101908537 A | 12/2010 |
| CN | 102347335 A | 2/2012 |
| CN | 102629628 A | 8/2012 |
| CN | 102651322 A | 8/2012 |

OTHER PUBLICATIONS

International Preliminary Report on Patentability Appln. No. PCT/CN2012/086501.

International Search Report mailed Mar. 21, 2013; PCT/CN2012/086501.

First Chinese Office Action dated Jan. 30, 2014; Appln. No. 201210047937.5.

Third Chinese Office Action dated Feb. 13, 2015; Appln. No. 201210047937.5.

Fourth Chinese Office Action Appln. No. 201210047937.5; Dated Jul. 9, 2015.

* cited by examiner

THIN FILM TRANSISTOR, METHOD FOR MANUFACTURING THE SAME, ARRAY SUBSTRATE AND DISPLAY DEVICE

FIELD OF THE INVENTION

Embodiments of the present invention relate to a Thin Film Transistor (TFT), a method for manufacturing the TFT, an array substrate and a display device.

BACKGROUND

In 21 century, display filed is dominated by flat panel display. Thin film transistor liquid crystal display (TFT-LCD) has the advantages of small volume, low energy consumption, low radiation, and etc., and thus prevails in the flat panel display market. Array substrate and manufacturing process thereof are key factors for determining the performance, yield and price of the TFT-LCD.

With the developments of the liquid crystal display panel towards large-size, high-resolution, high-frequency, three-dimensional view and active matrix organic light emitting diode (AMOLED), oxide semiconductor material with high carrier mobility has drawn great attentions. Oxide semiconductor material has good compatibility with apparatuses for manufacturing conventional TFT-LCD without the necessity of transforming these apparatuses, and thus oxide semiconductor material has an obvious advantage in mass production. However, when oxide semiconductor material is used as active layer and metal material is used as source and drain electrodes, oxide semiconductor material in channel region is damaged because enchant for etching the metal material damages the oxide semiconductor material, and thus performance of the thin film transistor is deteriorated.

In order to improve the stability of the TFT, the respective layers of the TFT are sequentially prepared by mask processes (mask photolithographic processes), and an etch stop layer is provided on the semiconductor active layer to secure the performance of the TFT. Accordingly, an additional mask process is added to the conventional process. In this case, the cost may be increased and it may be difficult to secure the product quality due to high cost and high complexity of the mask process.

SUMMARY OF THE INVENTION

A thin film transistor (TFT), a manufacturing method of the TFT, an array substrate and a display device are provide according to the embodiments of the invention to simplify the manufacture process, reduce the manufacture cost and improve the product yield.

According to an aspect of the invention, a manufacturing method of a TFT is provided. The method comprises: forming a gate electrode on a substrate; forming a gate insulating layer on the substrate and the gate electrode; forming an oxide semiconductor active layer, an etch stop layer and a source/drain electrode on the gate insulating layer, wherein the etch stop layer is obtained by an oxidation treatment.

According to another aspect of the invention, a TFT is provided. The TFT is manufactured by the above-described method.

According to still another aspect of the invention, an array substrate and a display device are provided. The array substrate and the display device comprise the TFT manufactured by the above-described method.

For example, the oxide semiconductor active layer and the etch stop layer are formed by a same mask process.

For example, the oxide semiconductor active layer, the etch stop layer and the source/drain electrode are formed by a same mask process.

According to still another aspect of the invention, a TFT is provided. The TFT comprises: a substrate; a gate electrode and a gate insulating layer, provided on the substrate; an oxide semiconductor active layer, provided on the gate insulating layer; an etch stop layer, provided on the oxide semiconductor active layer; and a source/drain electrode, provided on the oxide semiconductor active layer and on both sides of the etch stop layer, wherein the etch stop layer is obtained by an oxidation treatment.

For example, the etch stop layer comprises a metal element as same as that in the source/drain electrode.

For example, a first insulating layer in provided on the gate insulating layer, and the oxide semiconductor active layer is provided on the first insulating layer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

In order to make objects, technical solutions and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Figure 1:
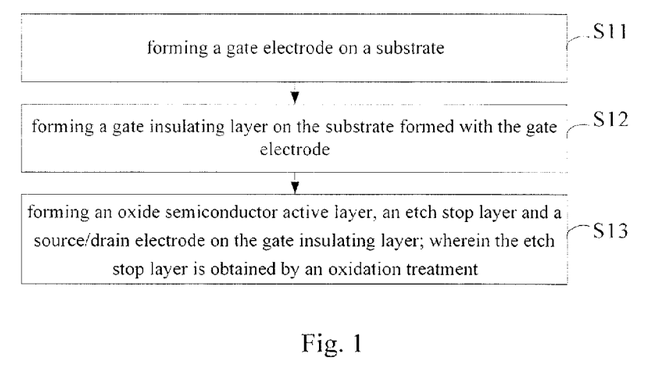
FIG. 1 is a flow chart showing a manufacturing method of a TFT according to embodiments of the invention.

As shown in FIG. 1, a manufacturing method of a TFT according to embodiments of the invention comprises the following steps:

S11. forming a gate electrode on a substrate by a mask process;

S12. forming a gate insulating layer on the substrate formed with the gate electrode; and S13. forming an oxide semiconductor active layer, an etch stop layer and a source/drain electrode on the gate insulating layer by a mask process, wherein the etch stop layer is obtained by an oxidation treatment.

It should be noted that, the expression "a source/drain electrode" in the embodiments of the invention denotes "a source electrode and a drain electrode".

According to an embodiment of the invention, the step S13 may comprise the following steps as shown in FIG. 2 to FIG. 9.

Figure 2:
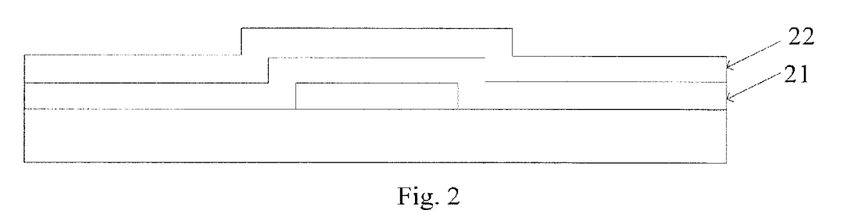
FIG. 2 to FIG. 9 are schematic structural views during a manufacturing method of a TFT according to an embodiment of the invention.

S131. forming a first thin film on the gate insulating layer 21 and performing an oxidation treatment on the first thin film to form a first insulating layer 22.

For example, an amorphous silicon thin film with a thickness of 200~500 Å is formed on the gate insulating layer 21 of SiNx under the temperature of 300~400° C., and then the amorphous silicon thin film is subjected to an oxygen ($O_2$) plasma treatment to form the first insulating layer 22 which is oxygen-rich, as shown in FIG. 2.

Figure 3:
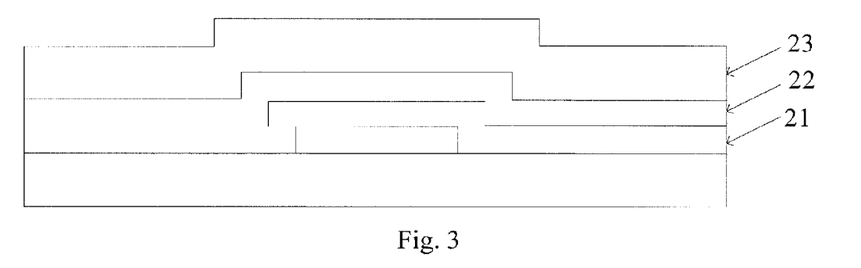

S132. forming an oxide semiconductor layer 23 on the first insulating layer 22, as shown in FIG. 3.

Figure 4:
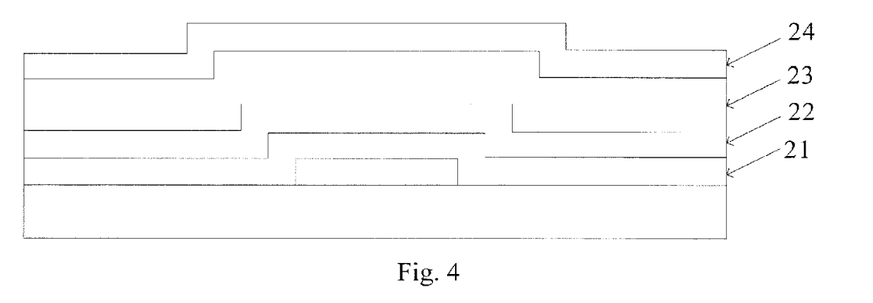

S133. forming a second thin film on the oxide semiconductor layer 23 and performing an oxidation treatment on the second thin film to form a second insulating layer 24 which is oxygen-rich.

For example, an amorphous silicon thin film with a thickness of 400~1000 Å is formed on the oxide semiconductor layer 23 under the temperature of 150-200° C., and then the amorphous silicon thin film is subjected to an oxygen ($O_2$) plasma treatment to form the second insulating layer 24, as shown in FIG. 4.

Figure 5:
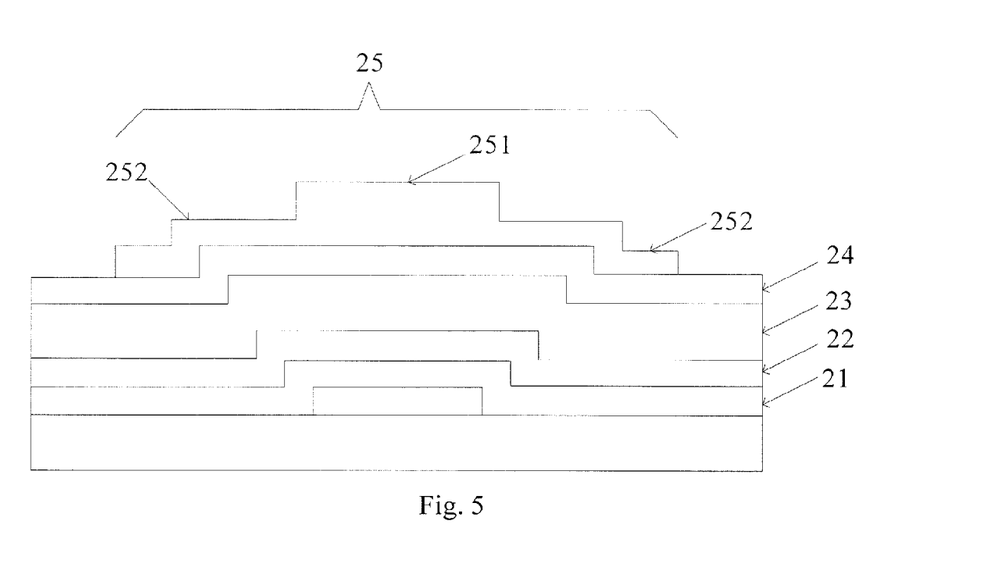

S134. applying a photoresist layer 25 on the second insulating layer 24, performing an exposure process by using a half-tone mask or a gray-tone mask, and forming a photoresist-completely-remained region 251, a photoresist-partially-remained region 252 and a photoresist-completely-removed region by an developing process, wherein the photoresist-completely-remained region 251 corresponds to the region of the etch stop layer, the photoresist-partially-remained region 252 corresponds to the region of the active layer and the photoresist-completely-removed region exposes the remaining regions on the second insulating layer 24, as shown in FIG. 5.

Figure 6:
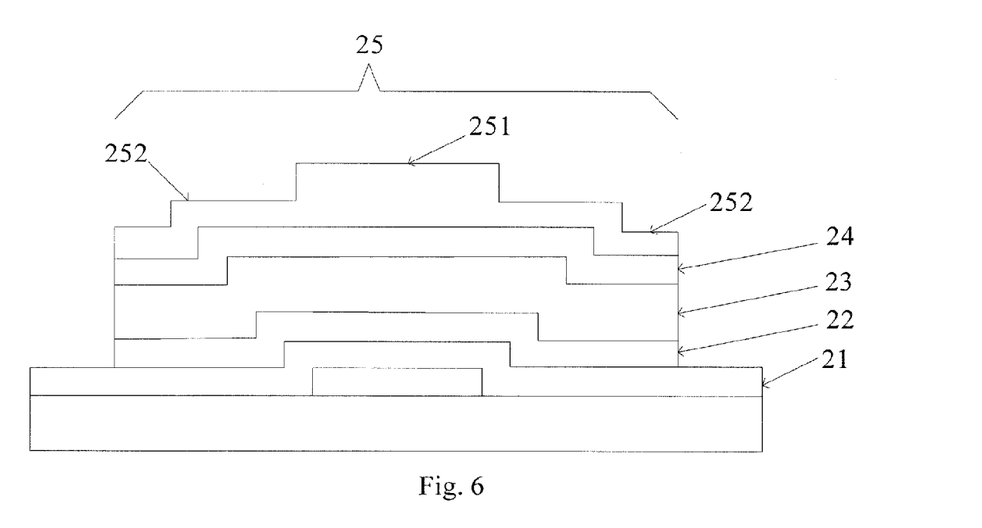

S135. removing the second insulating layer 24, the oxide semiconductor layer 23 and the first insulating layer 22 in the photoresist-completely-removed region by an etching process to obtain the active layer 23 and the first insulating layer 22, thus a silicon island is formed, as shown in FIG. 6.

Figure 7:
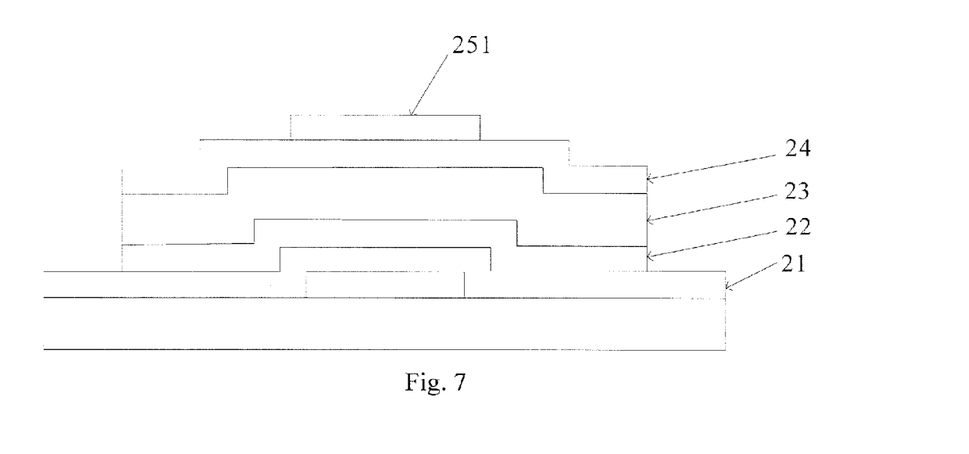

S136. removing the photoresist layer in the photoresist-partially-remained region 252 by an ashing process to expose the second insulating layer 24 in this region as shown in FIG. 7.

Figure 8:
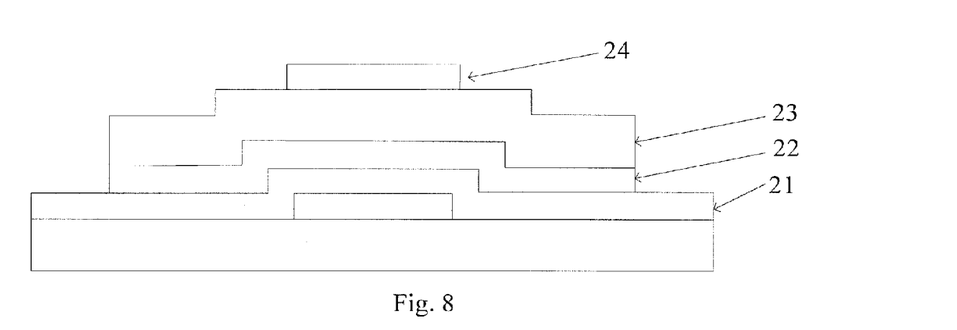

S137. removing the exposed second insulating layer 24 by an etching process, and then removing the remaining photoresist layer to form the etch stop layer made of the second insulating layer 24, as shown in FIG. 8.

Figure 9:
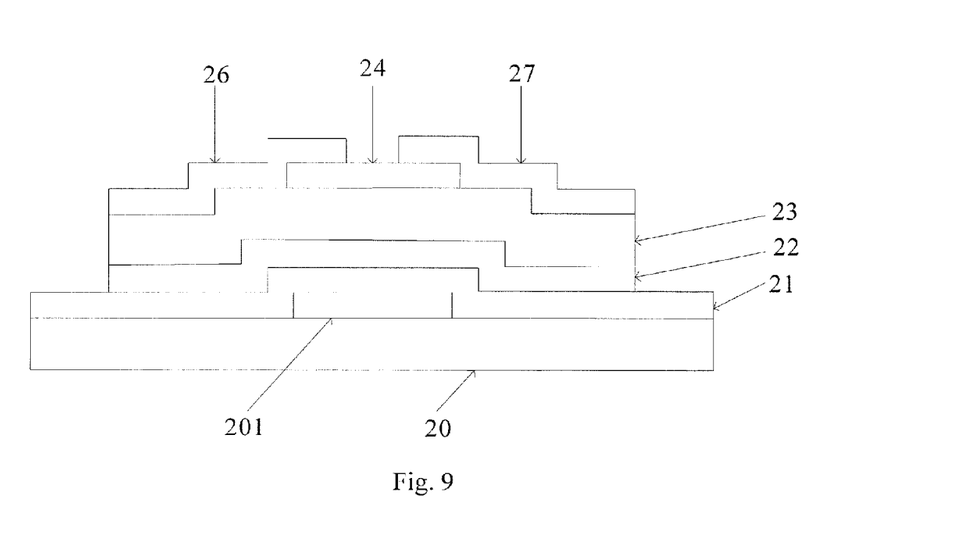

Finally, the source electrode 26 and the drain electrode 27 are formed on the oxide semiconductor layer 23 and the etch stop layer 24 by a mask process similar or same to the conventional technology, as shown in FIG. 9.

It should be noted that, the first thin film and the second thin film are formed by amorphous silicon in this embodiment; however the materials for forming the first and second thin films are not limited thereto and other materials such as aluminum oxide ($Al_2O_3$) can be employed.

If it is not necessary to provide the first insulating layer 22 in the resultant thin film transistor, the step S131 can be omitted in this embodiment, thus, the oxide semiconductor layer 23 is directly formed on the gate insulating layer 21 after the step S12, and then the step S133 and the sequential steps are performed.

With the manufacturing method of the TFT according to the embodiment of the invention, the etch stop layer is formed by an oxidation treatment, the etch stop layer and the oxide semiconductor layer are patterned by a same mask process with a half-tone mask or a gray-tone mask, it is not necessary to provide an additional mask process for the etch stop layer, thus the additional mask process can be omitted and the manufacture cost can be reduced. In addition, since the first insulating layer and the second insulating layer, which are oxygen-rich and formed by oxidation treatments, are respectively provided on the upper side and the lower side of the oxide semiconductor layer, abnormal characteristics of the TFT due to the diffusion of oxygen in the oxide semiconductor active layer into other layers of the TFT can be prevented, the diffusion of hydrogen atoms in the gate insulating layer of SiNx into the oxide semiconductor active layer can be simultaneously prevented, and thus the performance of the TFT can be improved. In addition, the gate insulating layer is formed by SiNx with a thickness of about 2000~4000 Å, the first insulating layer is formed by SiOx with a thickness of about 200~500 Å that is obtained by an oxidation treatment, the etch rate can be increased comparing with the convention technology in which SiOx is generally employed to form the gate insulating layer of the TFT; further, during the next step of forming via holes in the gate insulating layer, the etch time for forming the via holes can be shortened comparing with the conventional technology in which merely SiOx is employed to form the gate insulating layer, thus the production efficiency can be improved and the mass production can be easily realized. In addition, since the etch stop layer (i.e. the second insulating layer) has underwent an oxidation treatment and becomes oxygen-rich, the barrier property of the etch stop layer can be improved and the stability of the TFT can be maintained.

According to another embodiment of the invention, the step S13 may comprise the following steps as shown in FIG. 10 to FIG. 17.

Figure 10:
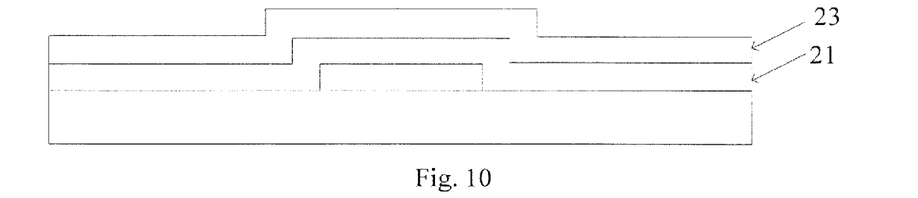
FIG. 10 to FIG. 16 are schematic structural views during a manufacturing method of a TFT according to another embodiment of the invention.

S131'. forming the oxide semiconductor layer 23 on the gate insulating layer 21, as shown in FIG. 10.

For example, the gate insulating layer 21 is formed by SiNx.

Figure 11:
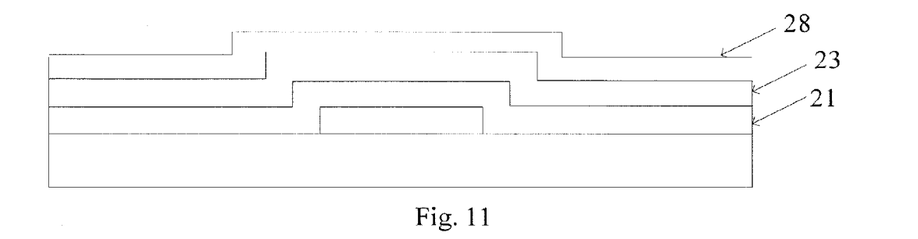

S132'. forming a metal film 28 on the semiconductor layer 23, as shown in FIG. 11.

For example, the metal film 28 is formed by a single metal layer or multiple metal layers.

Figure 12:
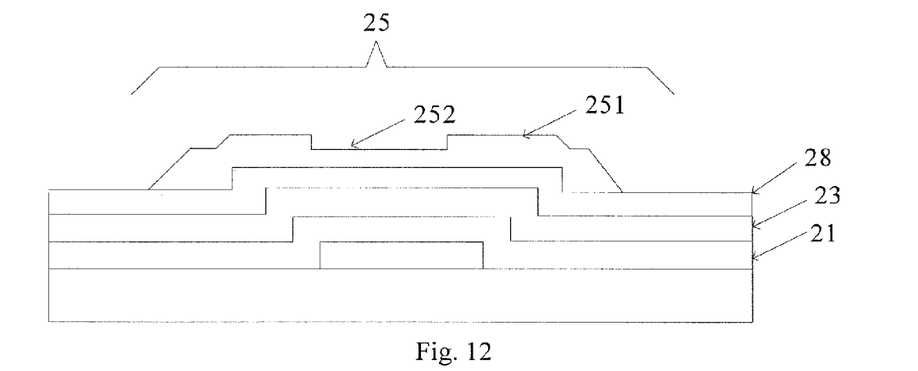

S133'. applying a photoresist layer 25 on the metal film 28, performing an exposure process by using a half-tone mask or a gray-tone mask, and forming a photoresist-completely-remained region 251, a photoresist-partially-remained region 252 and a photoresist-completely-removed region by an developing process, wherein the photoresist-completely-remained region 251 corresponds to the region of the source/drain electrode, the photoresist-partially-remained region 252 corresponds to a channel region of the TFT and the photoresist-completely-removed region exposes the remaining regions on the metal film 28, as shown in FIG. 12.

Figure 13:
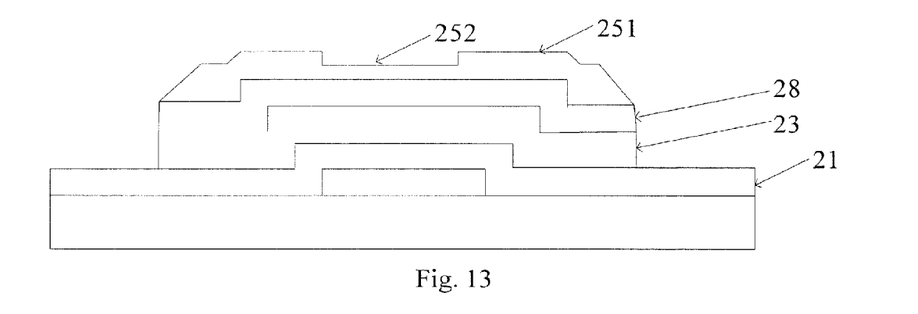

S134'. removing the metal film 28 and the oxide semiconductor layer 23 in the photoresist-completely-removed region by an etching process to obtain the metal film 28 and the active layer 23 which have a same covering area, as shown in FIG. 13.

Figure 14:
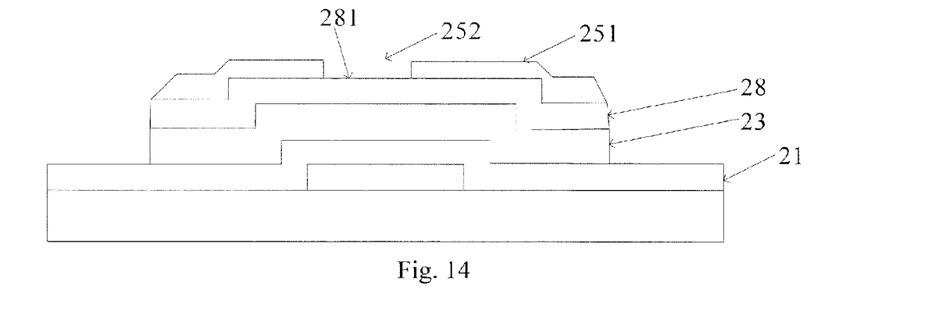

S135'. removing the photoresist layer in the photoresist-partially-remained region 252 by an ashing process to expose the metal film 281 in this region, as shown in FIG. 14.

Figure 15:
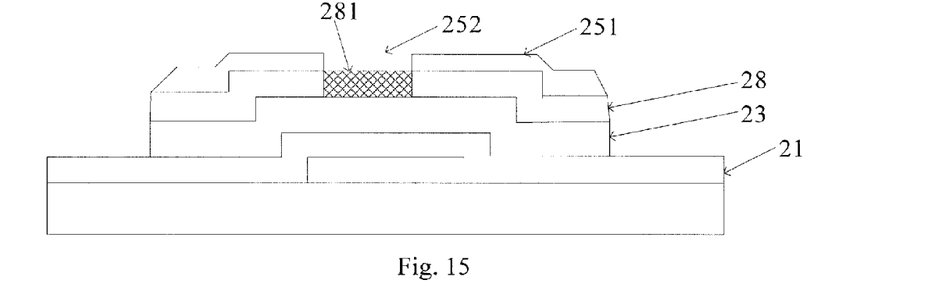

S136'. performing an oxidation treatment on the exposed metal film 281 so that the exposed metal film 281 is completely converted into an oxygen-rich insulating layer to form the etch stop layer, as shown in FIG. 15.

For example, an oxygen (O$_2$) plasma bombardment process is performed on the exposed metal film 281. By controlling the bombarding time, the exposed metal film 281 is completely converted into the insulating layer for forming the etch stop layer.

Figure 16:
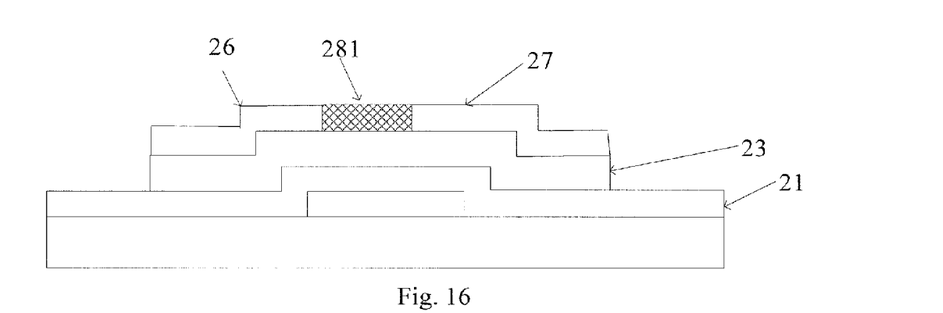

S137'. removing the photoresist layer in the photoresist-completely-remained region 251 to obtain the source electrode 26, the drain electrode 27 and the etch stop layer, as shown in FIG. 16.

According to still another embodiment of the invention, the step S13 may comprise the following steps as shown in FIG. 10 to FIG. 14 and FIG. 17 to FIG. 19.

S131". forming the oxide semiconductor layer 23 on the gate insulating layer 21, as shown in FIG. 10.

For example, the gate insulating layer 21 is formed by SiNx.

S132". forming the metal film 28 on the semiconductor layer 23, as shown in FIG. 11.

S133". applying the photoresist layer 25 on the metal film 28, performing an exposure process by using a half-tone mask or a gray-tone mask, and forming a photoresist-completely-remained region 251, a photoresist-partially-remained region 252 and a photoresist-completely-removed region by an developing process, wherein the photoresist-completely-remained region 251 corresponds to the region of the source/drain electrode, the photoresist-partially-remained region 252 corresponds to the channel region of the TFT and the photoresist-completely-removed region exposes the remaining regions on the metal film 28, as shown in FIG. 12.

S134". removing the metal film 28 and the oxide semiconductor layer 23 in the photoresist-completely-removed region by an etching process to obtain the metal film 28 and the active layer 23 which have a same covering area, as shown in FIG. 13.

S135". removing the photoresist layer in the photoresist-partially-remained region 252 by an ashing process to expose the metal film 281 in this region, as shown in FIG. 14.

Figure 17:
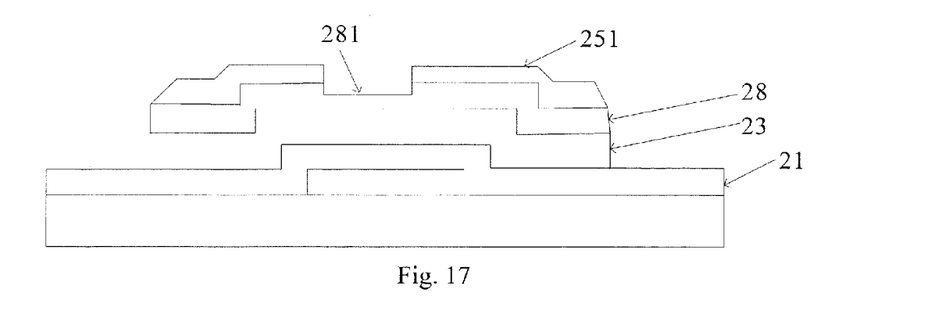
FIG. 17 to FIG. 19 are schematic structural views during a manufacturing method of a TFT according to still another embodiment of the invention.

S136". removing a portion of the metal film 281 exposed in the photoresist-partially-remained region by an etching process, as shown in FIG. 17.

For example, by controlling the etch time, the major portion of the metal film in the channel is etched and the minor portion is remained.

Further, the metal film can be formed by a single metal layer or multiple metal layers. In the case that the metal film is formed by multiple layers, the upmost layer can be removed or merely the lowest layer is remained.

Figure 18:
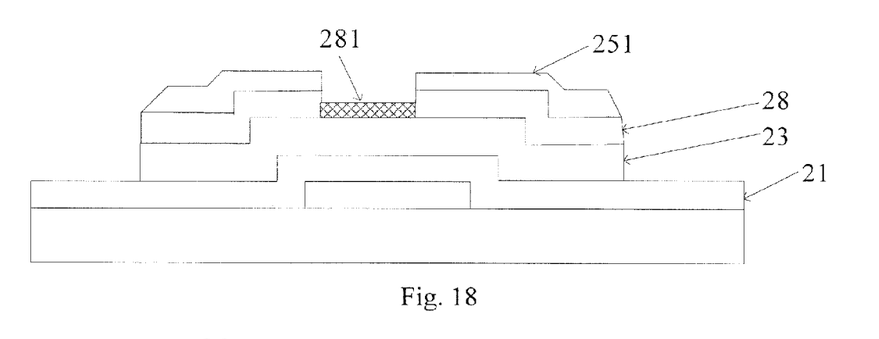

S137". performing an oxidation treatment on the remained metal film 281 so that the remained metal film 281 is completely converted into an oxygen-rich insulating layer to form the etch stop layer, as shown in FIG. 18.

For example, an oxygen (O$_2$) plasma bombardment process is performed on the remained metal film 281. By controlling the bombarding time, the remained metal film 281 is completely converted into the insulating layer for forming the etch stop layer.

Figure 19:
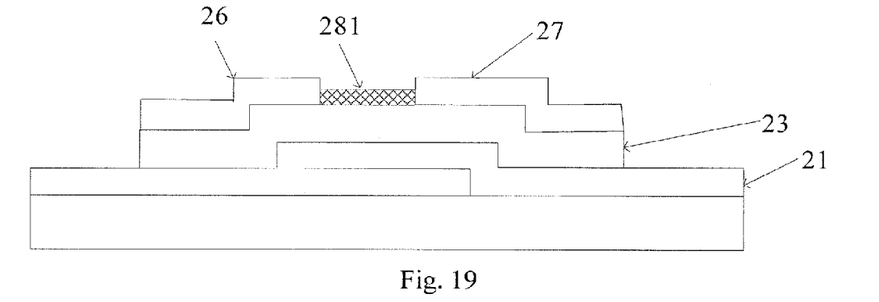

S138". removing the photoresist layer in the photoresist-completely-remained region 251 to obtain the source electrode 26, the drain electrode 27 and the etch stop layer, as shown in FIG. 19.

With the manufacturing method of the TFT according to the embodiments of the invention, the etch stop layer is formed by an oxidation treatment, the etch stop layer and the source/drain electrode are patterned by a same mask process with a half-tone mask or a gray-tone mask, it is not necessary to provide an additional mask process for the etch stop layer, thus the additional mask process can be omitted and the manufacture cost can be reduced. In addition, since the etch stop layer has underwent an oxidation treatment and becomes oxygen-rich, the barrier property of the etch stop layer can be improved and the stability of the TFT can be maintained.

Prior to the above-described steps S131' and S131" for forming the oxide semiconductor layer 23, a first thin film can be formed on the gate insulating layer 21. For example, an amorphous silicon thin film with a thickness of 200~500 Å is formed under the temperature of 300-400° C., and then the amorphous silicon thin film is subjected to an oxygen (O$_2$) plasma treatment to form the first insulating layer 22 which is oxygen-rich.

The materials for forming the first thin film are not limited to amorphous silicon, and other materials such as aluminum oxide (Al$_2$O$_3$) can be employed.

In this way, the first insulating layer 22, which has underwent an oxidation treatment, is provided between the gate insulating layer 21 and the oxide semiconductor active layer 23, thus the diffusion of hydrogen atoms in the gate insulating layer of SiNx into the oxide semiconductor active layer 23 can be prevented and the performance of the TFT can be improved. In addition, the gate insulating layer is constituted by SiNx and the first insulating layer 22, the etch rate can be increased; further, during the next step of forming via holes in the gate insulating layer, the etch time for forming the via holes can be shortened comparing with the conventional technology in which merely SiOx is employed to form the gate insulating layer, thus the production efficiency can be improved and the mass production can be easily realized.

According to embodiments of the invention, a TFT is provided. The TFT is manufactured by the above-described manufacturing method.

A structural example of the TFT according to an embodiment of the invention is shown in FIG. 9. The TFT comprises: a substrate 20, a gate electrode 201 and a gate insulating layer 21; a first insulating layer 22 formed on the gate insulating layer 21; an oxide semiconductor active layer 23 formed on the first insulating layer 22; a second insulating layer 24 formed on the oxide semiconductor active layer 23; a source electrode 26 and a drain electrode 27 formed on the oxide semiconductor active layer 23 and respectively provided on both sides of the second insulating layer 24. The first insulating layer 22 can be obtained by performing an oxidation treatment on amorphous silicon or aluminum oxide.

Figure 20:
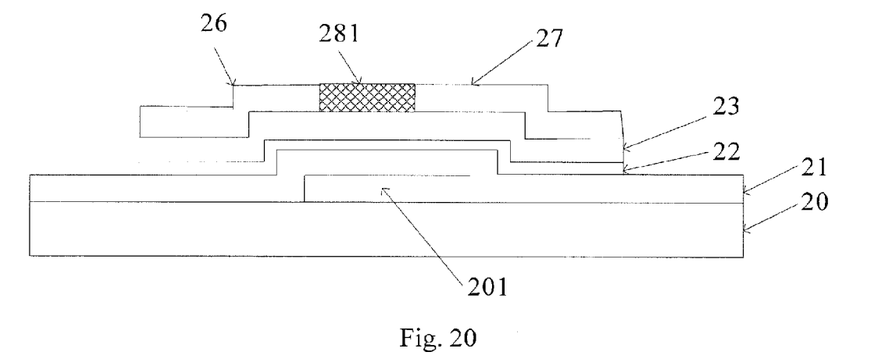
FIG. 20 is a schematic view showing a structure of a TFT according to embodiments of the invention.

It should be noted that, in the TFT according to the embodiments of the invention, the metal film for forming the source/drain electrode can be formed by a single metal layer or multiple metal layers, the etch stop layer can be obtained by performing an oxidation treatment on a portion of multiple metal layers or on the lowest layer of multiple metal layers. Further, the etch stop layer can be obtained by performing an oxidation treatment on the metal film which corresponds to the entire channel region, as shown in FIG. 20. That is, the metal film 281 corresponding to the channel region is not subjected to an etching process but merely is subjected to an oxidation treatment to form the etch stop layer. In this case, the surface of the etch stop layer 281 and the surfaces of the source electrode 26 and the drain electrode 27 are in a same plane.

In the TFT according to the embodiments of the invention, since the first insulating layer and the second insulating layer are respectively provided on the upper side and the lower side of the oxide semiconductor active layer, abnormal characteristics of the TFT due to the diffusion of oxygen in the oxide semiconductor active layer into other layers of the TFT can be prevented, the diffusion of hydrogen atoms in the gate insulating layer of SiNx into the oxide semiconductor active layer can be simultaneously prevented, and thus the performance of the TFT can be improved. In addition, since the oxygen-rich etch stop layer is provided on the channel region, the damages to the oxide semiconductor active layer in the channel region can be prevented and the stability of the TFT can be maintained.

According to embodiments of the invention, an array substrate is provided. The array substrate comprises the above-described TFT.

According to embodiments of the invention, a display device is provided. The display device comprises the above-described array substrate. The display device can be but not limited to liquid crystal display panel, organic light-emitting diode (OLED) panel, electrophoresis display panel, mobile, monitor, tablet PC and the like.

In the array substrate and display device according to the embodiments of the invention, since the first insulating layer and the second insulating layer are respectively provided on the upper side and the lower side of the oxide semiconductor active layer of the TFT, abnormal characteristics of the array substrate due to the diffusion of oxygen in the oxide semiconductor active layer into other layers of the TFT can be prevented, the diffusion of hydrogen atoms in the gate insulating layer of SiNx into the oxide semiconductor active layer can be simultaneously prevented, and thus the performance of the array substrate can be improved. In addition, since the second insulating layer is formed on the oxide semiconductor active layer and below the source/drain electrode, the damages to the oxide semiconductor active layer in the channel region can be prevented and the stability of the array substrate can be maintained.

According to the TFT, the manufacturing method of the TFT, the array substrate and the display device provided by the embodiments of the invention, the etch stop layer is obtained by performing an oxidation treatment during the manufacturing process of the TFT, the etch stop layer can be achieved by a same mask process together with the semiconductor active layer or together with the source/drain electrode, thus it is not necessary to provide an additional mask process for the etch stop layer. Accordingly, comparing the conventional technology in which the etch stop layer is formed by an additional mask process, the number of the mask processes can be decreased, the manufacture process can be simplified, the manufacture cost can be reduced and the production yield can be improved.

What are described above is related to the illustrative embodiments of the disclosure only and not limitative to the scope of the disclosure; the scopes of the disclosure are defined by the accompanying claims.

The invention claimed is:

1. A manufacturing method of a thin film transistor (TFT), comprising:
    forming a gate electrode on a substrate;
    forming a gate insulating layer on the substrate formed with the gate electrode;
    forming an oxide semiconductor active layer, an etch stop layer and a source/drain electrode on the gate insulating layer;
    wherein the oxide semiconductor active layer, the etch stop layer and the source/drain electrode are formed by a same mask process;
    wherein the etch stop layer and the source/drain electrode are made from a same metal material and the etch stop layer is obtained by an oxidation treatment which is performed on the metal material; and
    wherein forming the oxide semiconductor active layer, the etch stop layer and the source/drain electrode by a same mask process comprises:
    forming an oxide semiconductor layer on the substrate formed with the gate insulating layer;
    forming a metal film made of the metal material on the oxide semiconductor layer;
    applying a photoresist layer on and in contact with the metal film, performing an exposure process by using a half-tone mask or a gray tone mask and performing a developing process to form a photoresist-completely-remained region corresponding to a region of the source/drain electrode, a photoresist-partially-remained region corresponding to a channel region of the TFT and a photoresist-completely-removed region exposing remaining regions on the metal film;
    removing the metal film and the oxide semiconductor layer in the photoresist-completely-removed region by an etching process to obtain the metal film and the oxide semiconductor active layer which have a same covering area;
    removing the photoresist layer in the photoresist-partially-remained region by an ashing process to expose a portion of the metal film;
    performing the oxidation treatment on the exposed portion of the metal film so that the exposed portion of the metal film is completely converted into an oxygen-rich insulating layer for forming the etch stop layer; and
    removing remaining photoresist layer to obtain the source/drain electrode and the etch stop layer;
    wherein before performing the oxidation treatment, the metal film corresponding to the channel region is not subjected to an etching process, and a top surface of the etch stop layer and a top surface of the source/drain electrode are in a same horizontal plane.

2. The method according to claim 1, further comprising:
    forming a first thin film on the gate insulating layer and performing another oxidation treatment on the first thin film to form a first insulating layer,
    wherein the oxide semiconductor active layer is provided on the first insulating layer.

3. The method according to claim 2, wherein the gate insulating layer comprises SiNx, and the first insulating layer comprises SiOx.

4. The method according to claim 1, wherein a metal film is formed on the oxide semiconductor active layer, the etch stop layer is formed by oxidizing a part of the metal film in a channel region of the TFT, the source/drain electrode is the remaining part of the metal film which are located at two opposite sides of the oxidized part.

* * * * *